United States Patent
Miyachi et al.

(10) Patent No.: US 7,350,165 B2
(45) Date of Patent: Mar. 25, 2008

(54) COMPILER

(75) Inventors: Ryoko Miyachi, Hirakata (JP); Tomoo Hamada, Ibaraki (JP); Hajime Ogawa, Suita (JP); Shohei Michimoto, Takatsuki (JP); Yasuhiro Yamamoto, Kyoto (JP); Teruo Kawabata, Suita (JP); Hirotetsu Tomita, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 400 days.

(21) Appl. No.: 11/087,752

(22) Filed: Mar. 24, 2005

(65) Prior Publication Data
US 2005/0216869 A1    Sep. 29, 2005

(30) Foreign Application Priority Data
Mar. 29, 2004    (JP)    ............................. 2004-095942

(51) Int. Cl.
G06F 17/50    (2006.01)
(52) U.S. Cl. ......................................................... 716/3
(58) Field of Classification Search ..................... 716/3
See application file for complete search history.

(56) References Cited

U.S. PATENT DOCUMENTS 6,021,266 A    2/2000    Kay

2001/0034876 A1    10/2001    Panchul et al.
2003/0172055 A1*    9/2003    Prakash et al. ................. 707/1
2003/0196194 A1*    10/2003    Johns et al. ................. 717/136
2004/0025150 A1*    2/2004    Heishi et al. ................ 717/154
2004/0163072 A1*    8/2004    Levy .......................... 717/106

FOREIGN PATENT DOCUMENTS

JP    2000-056981    2/2000

* cited by examiner

Primary Examiner—Paul Dinh
Assistant Examiner—Suresh Memula
(74) Attorney, Agent, or Firm—Wenderoth, Lind & Ponack, L.L.P.

(57) ABSTRACT

A compiler apparatus enables description of a particular hardware module in the existing programming language, although the description has not been possible in hardware designing to input programming language. In the header file 24, a particular hardware indescribable in programming language is defined. And the compiler apparatus includes a parser unit 30 analyzing syntax of source program 22, an intermediate code converting unit 32 converting the syntactically analyzed source program 22 to an intermediate code and code generating unit 36 converting the intermediate code to the RTL description. The intermediate code converting unit 32 includes a detecting unit 40 detecting a particular hardware defined in the header file 24 out of the source program 22 and a replacing unit 42 replacing the detected particular hardware in the detecting unit 40 with the intermediate code corresponding to a particular hardware.

9 Claims, 10 Drawing Sheets

FIG. 9
(a)
```
#include "hls.h"
SC_MODULE(input8_t a, input8_t b, input8_t c, output8_t d, output8_t e, output8_t f)
{
    d= a+b;           /*using adder*/
    e= _mac(a, b, c); /*a+(b*c)*/
    f= b*c;           /*using multiplier*/
}
```
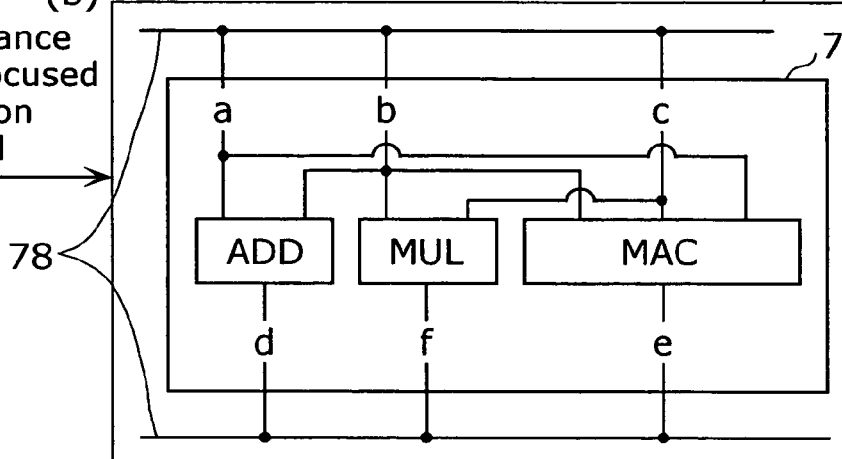
(b) Performance speed focused /no option specified
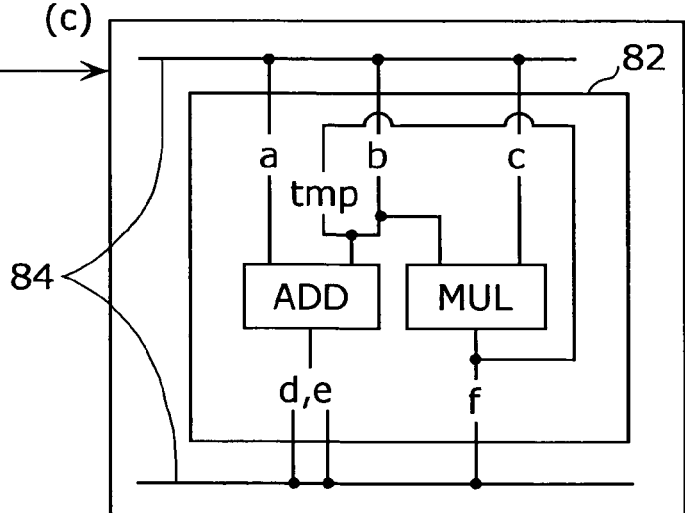
(c) Circuit area focused FIG. 10
(a)
```
#include "hls.h"
SC_MODULE(input8_t a, input8_t b, input8_t c, output8_t d, output8_t e)
{
    d= a*b;      /*using multiplier*/
    e= _mac(c,a,b);   /*c+(a*b)*/
}
```
Performance speed focused /no option specified
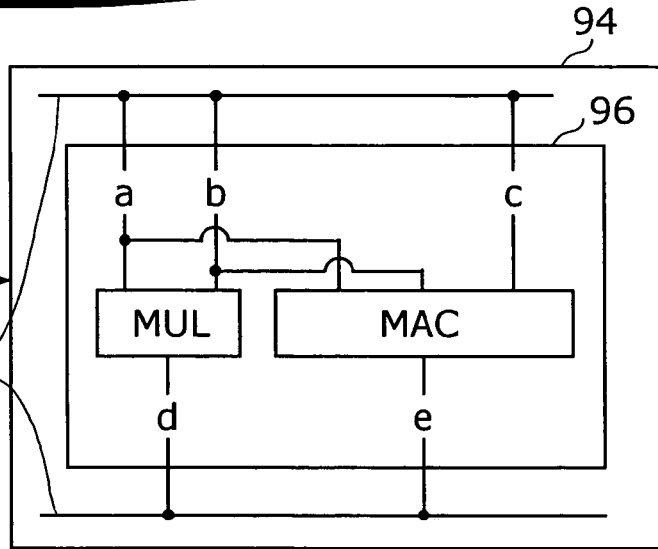
Circuit ared focused
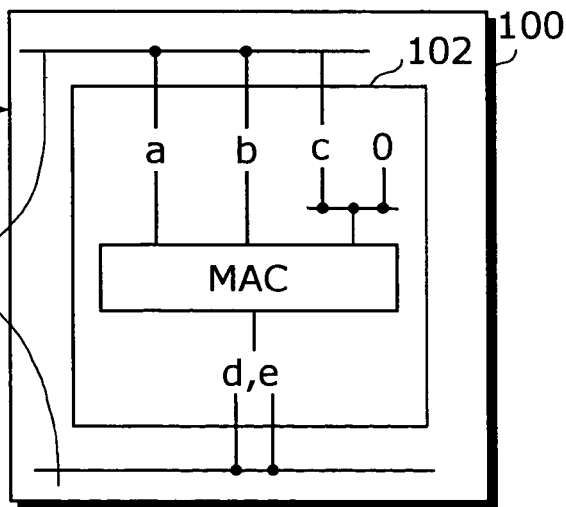

COMPILER

BACKGROUND OF THE INVENTION (1) Field of the Invention

The present invention relates to a compiler, and more particularly, to a compiler converting a source program in a high-level language to a register transfer level (RTL) description described in hardware description language.

(2) Description of the Related Art

In designing hardware by using a source program as input described in an existing programming language, a particular hardware module (a particular hardware module to realize a specific processor and input/output interface), which is indescribable by the language directly, exists. Conventionally, whether or not a particular hardware module in the source program exists needs to be judged by an intermediate code being converted from the source program.

On the other hand, in developing software using an existing programming language as input, a method of generating a specific operation instruction using a function is known. (e.g. Japanese Laid-Open Patent application No. 2000-56981). However, this sort of method has not been known in hardware designing yet.

As mentioned above, in designing hardware using an existing programming language as input, the existence of a particular hardware module, which is indescribable by the language directly, is judged by an intermediate code. However, judging the existence of a particular hardware module is difficult, therefore, an inefficient circuit such as unfavorably large circuit area might be formed. And the method disclosed in the Japanese Laid-Open Patent application No. 2000-56981 does not premise the hardware designing, and hence the method is not substantially applicable to the hardware designing, since the optimization of such as circuit area is not considered.

SUMMARY OF THE INVENTION

An object of the present invention is providing a compiler enabling description of a particular hardware module to solve the problem mentioned above, since the description using an existing programming language as input is impracticable in hardware designing.

A compiling method in the present invention is a method of compiling to convert a source program and a header file included in the source program described in the programming language to the register transfer level (RTL) description described in hardware description language. In the header file, a particular hardware indescribable in the programming language is defined. And the header file includes a parser step to analyze syntax of the source program, an intermediate code conversion step to convert the source program analyzed syntactically to an intermediate code, and an RTL description conversion step to convert the intermediate code to RTL description. Furthermore the intermediate code conversion step includes a detection step to detect the particular hardware defined in the header file out of the source program, and also a replacing step to replace the particular hardware detected in the detecting step with the intermediate code corresponding to the aforementioned particular hardware.

The particular hardware defined in the header file is replaced with the intermediate code, and the RTL description of hardware description language is generated. Thus, a user is able to describe the particular hardware in the source program using the programming language.

Preferably, in the header file, a class defining the input/output interface type of the particular hardware is defined, and in the detecting step, the data for the input/output interface type is detected. And both input interface type and output interface type as the input/output interface type may be included. Moreover, the method of the class is to define an operator which uses the input/output interface type data as operand. In the detecting step, the operator corresponding to the definition of the class method and the data which is the operand for the operator are detected. In the replacing step, the detected operator and the aforementioned data may also be replaced with an intermediate code of the corresponding particular hardware.

By means of defining the class of input/output interface type, the operation of the input/output interface type can be regarded as a general-purpose type operation. Thus, the programming by the user can be facilitated similarly to using the programming language and the efficiency for generating the RTL description can be improved.

In the header file, a specific operation function, which defines a specific operation instruction executing operation using the particular hardware, is defined. In the detecting step, a function corresponding to the definition of the specific operation function is detected. And in the replacing step, the detected function may be replaced with an intermediate code of the corresponding particular hardware.

The definition of the specific operation instruction in the header file can help improve generating efficiency of the RTL description corresponding to the specific operation instruction.

Preferably, the above-mentioned compiling method further includes a judging step to judge whether or not the intermediate code of the particular hardware obtained in the replacing step should be converted to the RTL description of the particular hardware based on the predetermined instruction information. In the RTL description converting step, the intermediate code is converted to the RTL description based on the judgment made in the judging step. The predetermined instruction information may include an instruction emphasizing the size of the circuit area of a hardware corresponding to the RTL description. In the judging step, when the predetermined instruction information indicates the emphasis on the circuit area, it is judged that the RTL description overlapping the particular hardware and the hardware other than the particular hardware is generated. In the RTL description converting step, the RTL description may be generated based on the judgment made in the aforementioned judging step.

By means of the circuit area-focused indication, the RTL description overlapping a particular hardware and other hardware can be generated. Consequently, the RTL description representing the downsizing circuit area is generated.

Preferably, in the predetermined instruction information, an instruction emphasizing the hardware performance speed for the RTL description is further included. And in the judging step, when the predetermined instruction information is the performance speed-focused, the judgment generating the RTL description corresponding to the particular hardware is made. In the RTL description converting step, the RTL description is generated based on the judgment made in the aforementioned judging step.

In the case where the hardware performance speed is emphasized, the RTL description of a particular hardware is generated. Hence, a hardware utilizing the particular hardware as an exclusive circuit is generated and the performance speed can be improved.

The present invention provides a compiler enabling a description of a particular hardware module, which description being impracticable by the programming language, in designing hardware using the existing programming language as input.

Moreover the operation of input/output interface type can be regarded as the operation of general-purpose type.

Besides the generating efficiency of the RTL description corresponding to a specific operating instruction can be improved.

Furthermore, the RTL description with downsized circuit area can be generated by user's instruction. Therefore the electric power consumption can be reduced, and the RTL description with high performance speed can be generated by user's instruction as well.

As further information about the technical background for this application, the disclosure of Japanese Patent Application No. 2004-095942 filed on Mar. 29, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 9 shows an example of a source program and an RTL description after converting the source program.

FIG. 10 shows another example of a source program and an RTL description after converting the source program.

DESCRIPTION OF THE PREFERRED EMBODIMENT(S)

A compiler apparatus related to the embodiments of the present invention will hereinafter be described referring the drawings.

Figure 1:
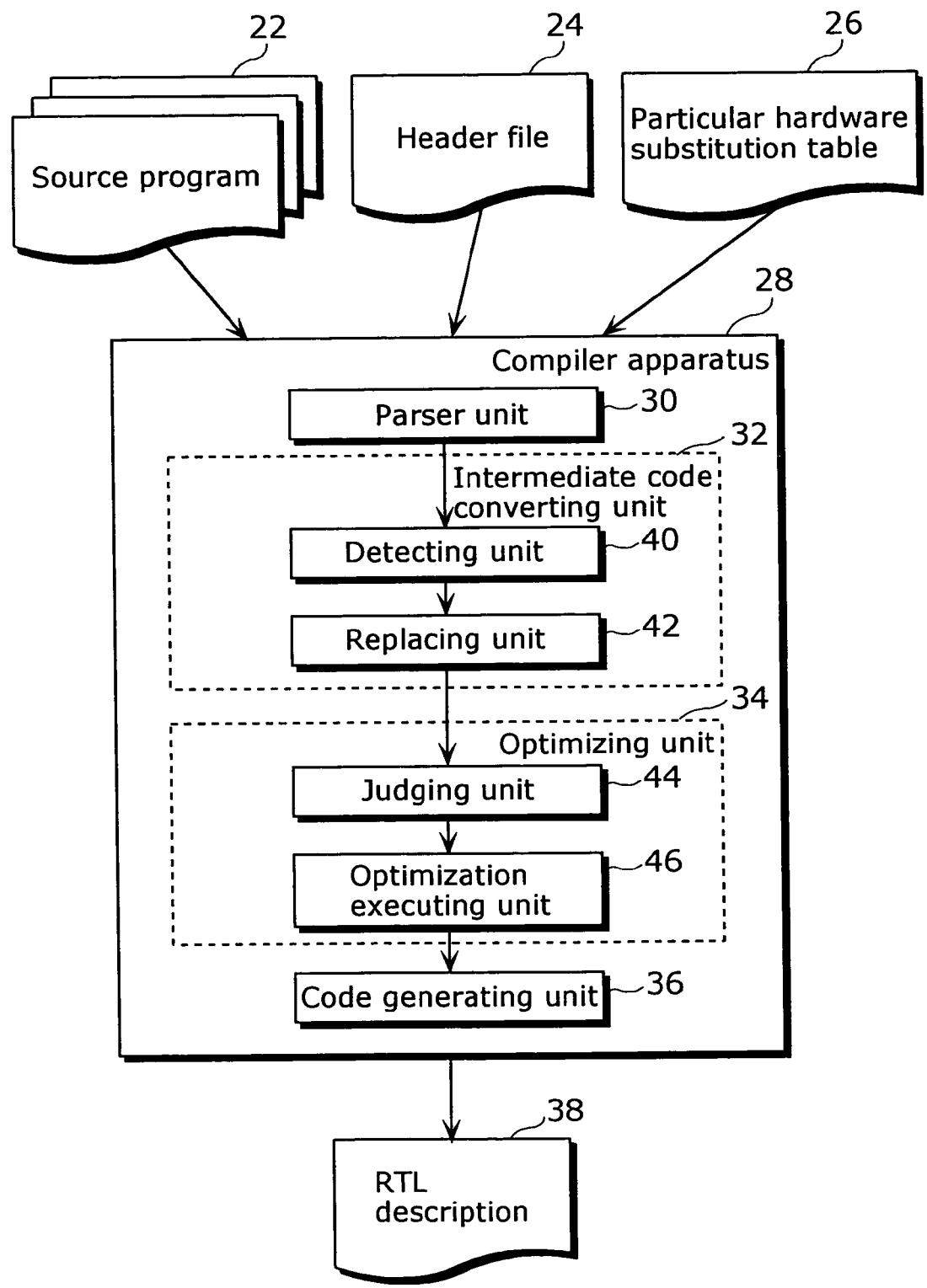
FIG. 1 shows a configuration of a compiler apparatus in the embodiment of the present invention.

FIG. 1 shows the configuration of a compiler apparatus related to the embodiments of the present invention.

[Configuration of the Compiler]

The compiler apparatus 28 converts a source program 22 describing the hardware performance in a programming language to register transfer level (RTL) description. The compiler apparatus 28 includes a parser unit 30, an intermediate code converting unit 32, an optimizing unit 34 and a code generating unit 36. The compiler apparatus 28 is realized as a high-level synthesis (HLS) compiler executed on the computer. Each processing unit in the compiler apparatus 28 corresponds to either a module or a step included in the compiler apparatus.

The parser unit 30 is a processing unit to include a header file 24 in a source program 22, and to analyze syntax of the source program 22.

Now considering a case that a class defining the input/output interface type is defined in the header file 24, and in the method in the class, an operator using the data of the input/output interface type is defined. And also, in the header file 24, a function defining a specific operation instruction using a particular processor (hereinafter called "specific operation function") is defined. These input/output interface type and a program using the specific operation function are described in the source program 22.

The intermediate code converting unit 32 is a processing unit to convert syntactically analyzed source program 22 to an intermediate code.

Figure 2:
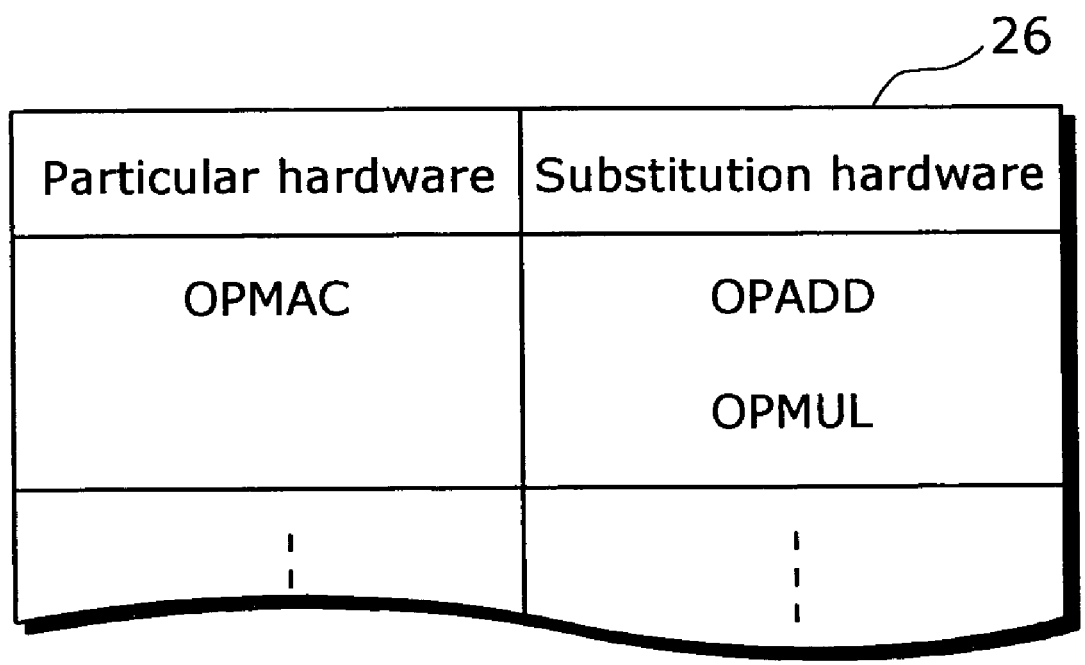
FIG. 2 shows an example of a particular hardware substitution table.

The optimizing unit 34 is a processing unit to optimize an intermediate code based on the table described in the particular hardware substitution table 26 to be explained later. The particular hardware substitution table 26 shows the relation between a particular hardware (particular processor and input/output interface) and a regular hardware. FIG. 2 shows an example of the particular hardware substitution table 26. It is indicated that a particular hardware "sum of products processor" can be substituted by an "adder" and a "multiplier" in FIG. 2. The "sum of products processor", the "adder" and the "multiplier" are represented by "OPMAC", "OPADD" and "OPMUL" respectively, which are used in the figures in the description hereinafter.

The code generating unit 36 is a processing unit to convert the optimized intermediate code to RTL description.

The intermediate code converting unit 32 includes a detecting unit 40 and a replacing unit 42. As mentioned above, a particular hardware such as an input/output interface and particular processors are defined in the header file 24. The detecting unit 40, in the source program 22, detects whether or not the input/output interface type operator defined in the header file 24 and the specific operation function using the particular processor are referred. Actually, the detecting unit 40 detects the source code executing input/output interface type operation or the source code using specific operation function whether or not a group of an operator and a type of data as an object of operation and a group of a function and a type of data as an object of the operation conforming to the definition in the method described in the header file 24.

When it is detected that the operator or the specific operation function are referred in the detecting unit 40, the replacing unit 42 replaces the source code executing input/output interface type operation or the source code using specific operation function to an intermediate code representing the particular hardware (hereinafter called "particular hardware intermediate code"). And also the other source codes are converted to intermediate codes.

The optimizing unit 34 includes a judging unit 44 and an optimization executing unit 46.

The judging unit 44 judges whether or not the particular hardware intermediate code replaced in the replacing unit 42 should be converted directly to RTL description as a particular hardware. The judging unit 44 also judges whether the performance speed should be emphasized, and whether or not the particular hardware intermediate code obtained in the replacing unit 42 should be overlapped with other hardware based on the compiling option or the pragma etc. indicating circuit area-focused or not.

The optimization executing unit 46 executes optimization of the intermediate codes including the particular hardware intermediate code. The optimization processing executed by the optimization executing unit 46 is a normal optimizing processing for HSL compiler and not explained in detail herein.

[Processing by Compiler Apparatus]

The processing executed by the compiler apparatus 28 will now be explained.

Figure 3:
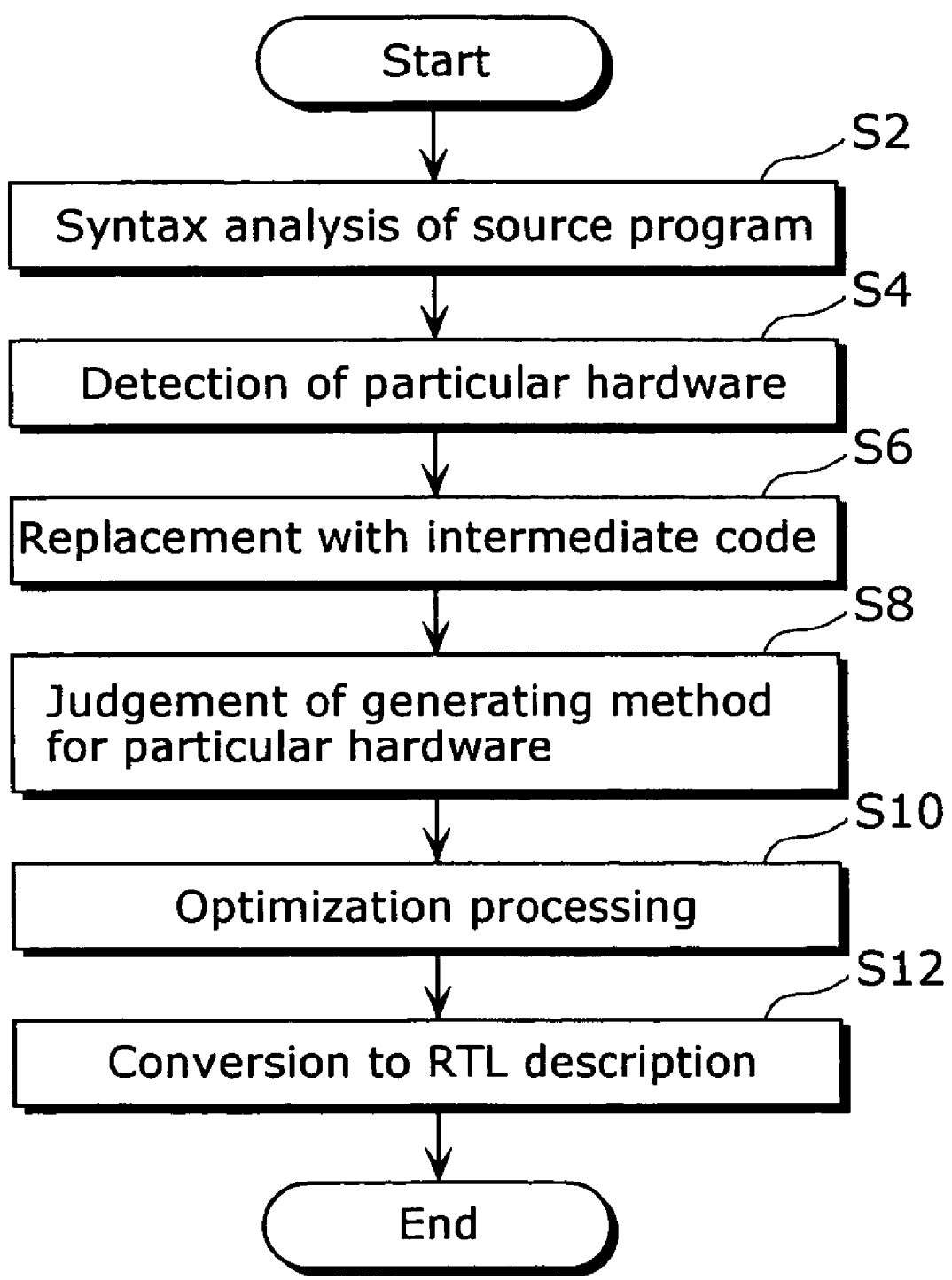
FIG. 3 shows a processing flowchart executed by the compiler apparatus.

FIG. 3 shows a processing flowchart executed by the compiler apparatus 28. The parser unit 30 reads the source program 22 and the header file 24, and executes syntax analysis processing (S2). The detecting unit 40, in the source program 22, detects whether or not the input/output interface type operator defined in the header file 24 and the specific operation function using the particular processor are referred (S4). The replacing unit 42 replaces the source code executing input/output interface type operation or the source code using specific operation function with a particular hardware intermediate code. The replacing unit 42 also replaces the other source codes with intermediate codes (S6).

The detecting processing (S4) and the replacing processing (S6) now will be explained in detail with specific examples.

Figure 4:
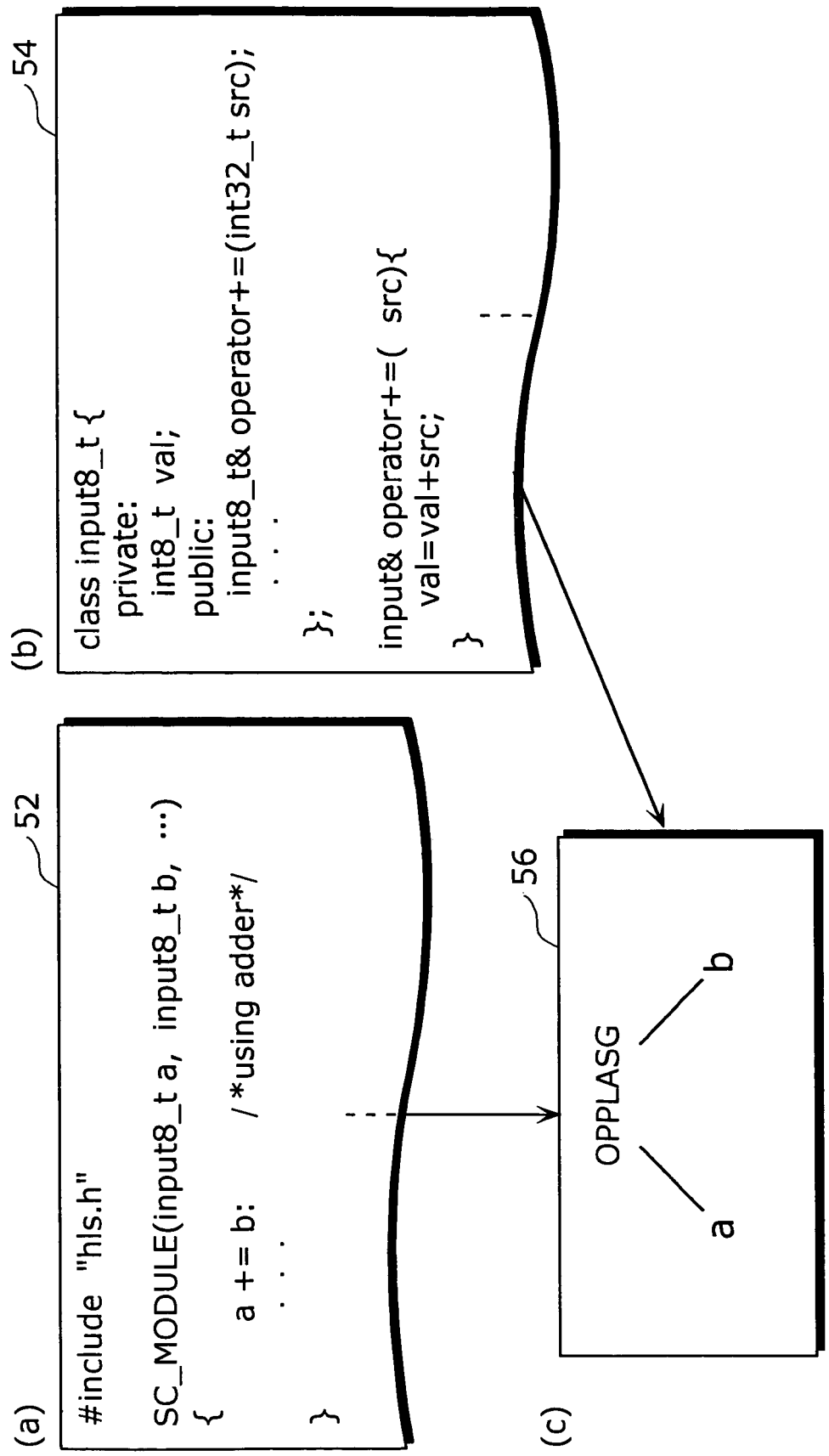
FIG. 4 shows an explanation about a detecting processing (S4 in FIG. 3) and a replacing processing (S6 in FIG. 3).

FIG. 4 shows an explanation about a detecting processing (S4 of FIG. 3) and a replacing processing (S6 of FIG. 3), and (a) shows an example of a source program, (b) shows an example of a header file, (c) shows a tree-structured intermediate code respectively.

As shown in FIG. 4 (b), class "input8_t" of input interface type is defined, and the operator "+=" are defined, which targets input interface type data, as a method in a class.

The detecting unit 40 detects the operator "+=" defined in the header file 54 and the operator "+=" in the source program 52 corresponding to the data type, which is an object of the operation by the operand, "input8_t".

Normally, the operator defined in the header file 54 is a function call. The operator "+=" detected in the detecting unit 40 are converted to the particular hardware intermediate codes 56 indicating operator "+=" in the replacing unit 42. The particular hardware intermediate codes 56 indicate that, where "a" and "b" are input interface type variables, operation "+=" is executed.

Figure 5:
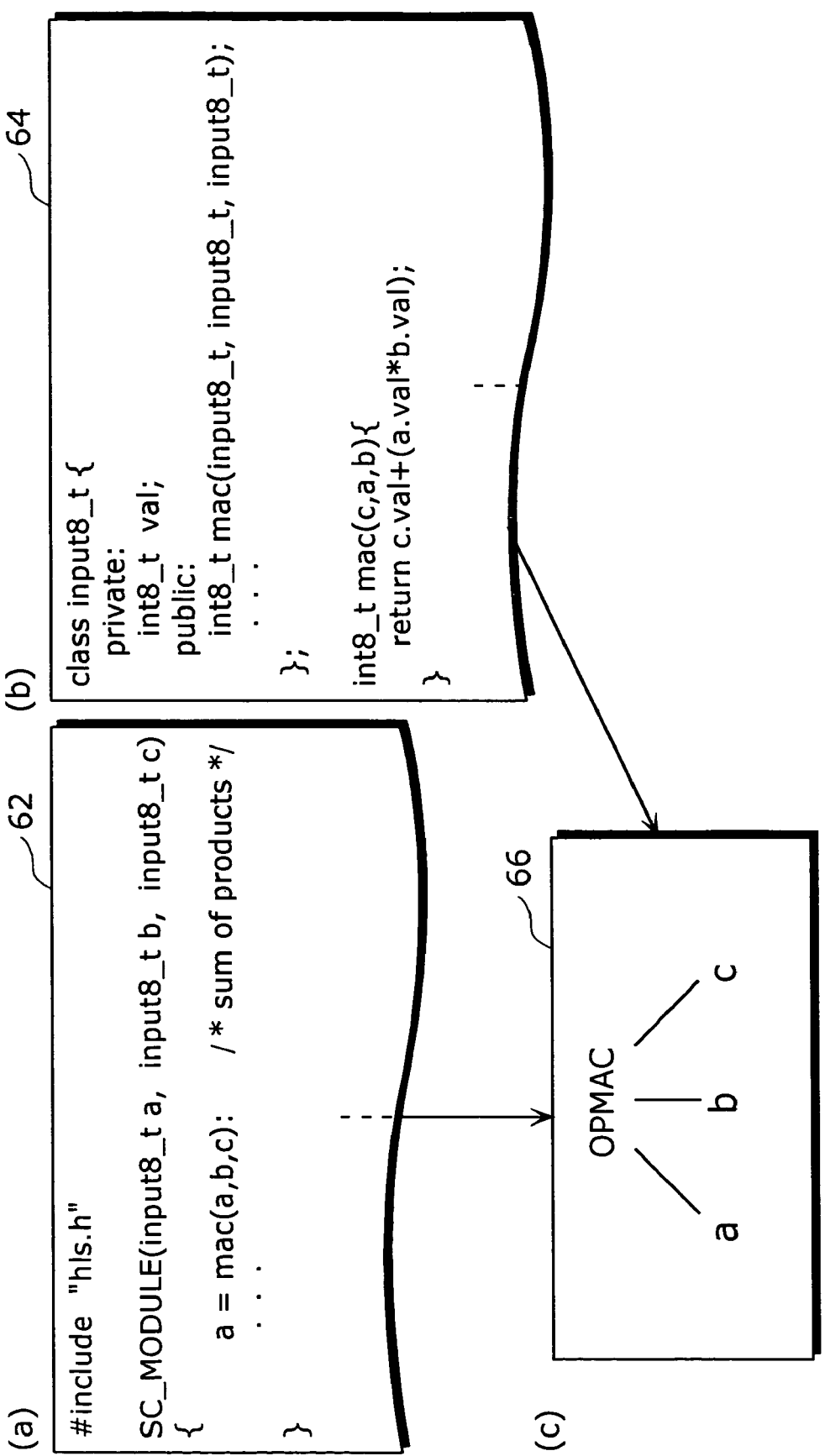
FIG. 5 shows another case of a detecting processing (S4 in FIG. 3) and a replacing processing (S6 in FIG. 3).

FIG. 5 shows another case of a detecting processing (S4 in FIG. 3) and a replacing processing (S6 in FIG. 3), (a) shows an example of a source program, (b) shows an example of a header file and (c) shows a tree-structured intermediate code.

As shown in FIG. 5 (b), class "input8_t" of input interface type is defined, and the specific operation function "mac" is defined, which targets input interface type data, as a method in a class.

The detecting unit 40 detects a specific operation function "mac" in the source program 62 which conforms to the specific operation function "mac" defined in the header file 64 and the specific operation function "mac" of an input data type "input8_t".

Normally, the function defined in the header file 64 is a function call, the specific operation function "mac" detected in the detecting unit 40 is converted to a particular hardware intermediate code 66 indicating sum of products operation in the replacing unit 42. The particular hardware intermediate codes 66 indicate that, where "a", "b" and "c" are input interface type variables, a specific operation function "mac" is called using the variables as arguments.

The judging unit 44 judges whether or not a particular hardware intermediate code replaced in the replacing unit 42 should be converted directly to RTL description as a particular hardware. The judging unit 44 also judges whether or not the particular hardware intermediate code obtained in the replacing unit 42 should be overlapped with other hardware, based on the compiling option or the pragma so on indicating whether or not the performance speed-focused, and also circuit area-focused. (S8 in FIG. 3). The judging processing (S8) will be described later.

Subsequently, the optimization executing unit 46 executes a regular optimizing processing in HSL compiler (S10). The code generating unit 36 converts the optimized intermediate code to RTL description 38 (S12).

Figure 6:
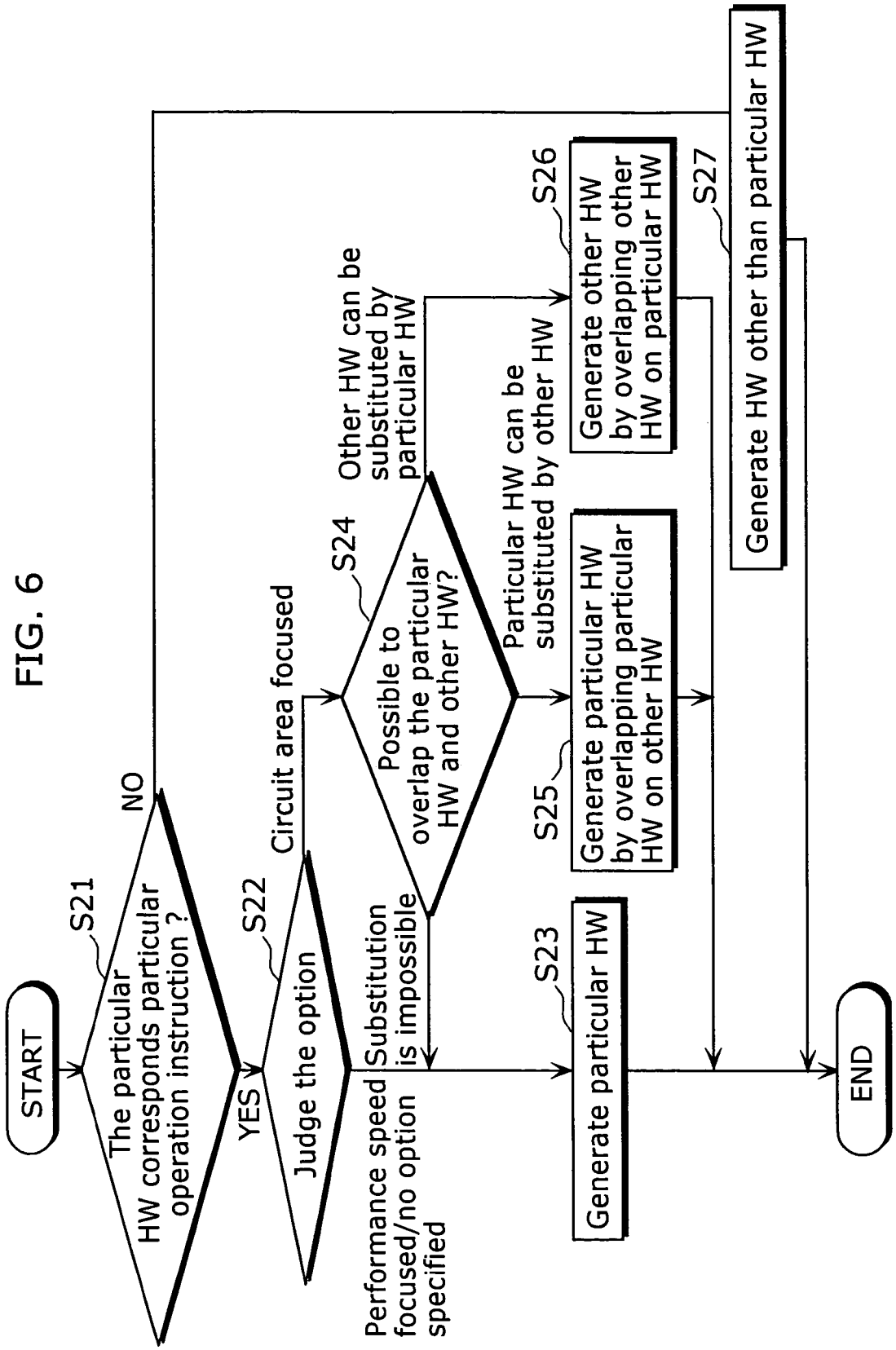
FIG. 6 shows a flowchart of a judging processing in detail.

The judging processing (S8) now will be explained. FIG. 6 shows a flowchart of a judging processing in detail.

The judging unit 44 executes the following processing for the particular hardware out of the intermediate codes replaced in the replacing unit 42. Actually, the judging unit 44 judges whether or not the particular hardware is a particular operation instruction (S21). When the particular hardware is not a particular operation instruction (NO: S21), the hardware is related to input/output interface. Consequently, the hardware is regarded as a normal hardware and the RTL description is generated (S27).

When the particular hardware is a particular operation instruction (YES: S21), the judging unit 44 judges the option set up at the time of compiling (S22). The options are circuit area-focused prioritizing downsizing circuit option and performance speed-focused prioritizing the improvement of the performance speed option. When no option is specified, the hardware performs the same as in the case where the performance speed-focused option is specified.

When the option is specified as performance speed-focused or not specified particularly (performance speed-focused/no option specified: S22), the judging unit 44 determines to generate the RTL description by considering the particular hardware intermediate code generated at the replacing unit 42 as a particular hardware (S23).

When the option is specified as circuit area-focused (circuit area-focused: S22), the judging unit 44 judges whether or not the particular hardware and other hardware can be overlapped (S24). "Overlapping the particular hardware and other hardware" represents "substituting the particular hardware for other hardware" or "substituting other hardware for the particular hardware. The judgment method for feasibility of overlapping the particular hardware and other hardware will be described hereinafter using FIG. 7.

When it is judged that the particular hardware can be substituted by other hardware (possible to substitute other hardware for the particular hardware: S24), the judging unit 44 determines to generate the RTL description by overlapping the particular hardware on other hardware (S25).

When it is judged that the other hardware can be substituted by the particular hardware (possible to substitute the particular hardware for other hardware: S24), the judging unit 44 determines to generate the RTL description overlapping the particular hardware on other hardware (S26).

When it is judged that overlapping the particular hardware and other hardware is impossible (Substitution is impossible: S24), the judging unit 44 determines to generate the RTL description by considering the particular hardware intermediate code generated at the replacing unit 42 as a particular hardware (S23).

Figure 7:
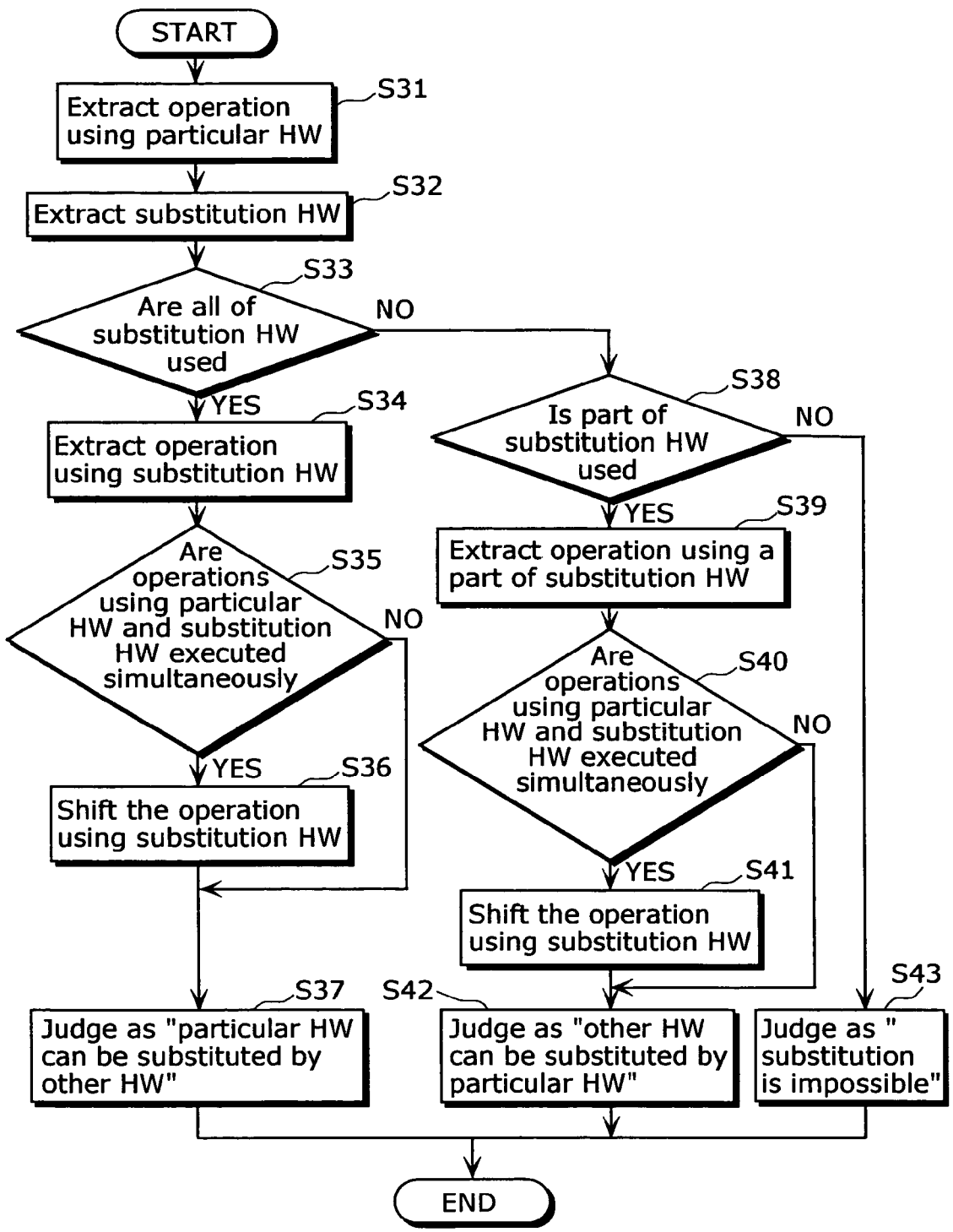
FIG. 7 shows a flowchart of a judging processing whether or not an overlapping a particular hardware and other hardware is possible (S24 in FIG. 6).

The judging processing for overlapping now will be described (S24). FIG. 7 shows a flowchart of a judging processing whether or not an overlapping of the particular hardware and other hardware is possible (S24 in FIG. 6).

The judging unit 44 extracts the operation instruction using the particular hardware out of the source program 22 (531). In this step, the judging unit 44 extracts the operation instruction using the particular hardware by extracting the particular hardware intermediate code out of the intermediate codes generated at the replacing unit 42.

The judging unit 44 detects the hardware substitute to substitute for the particular hardware used in the operation instruction extracted in the operation instruction extracting processing (S31) (532). The judging unit 44 performs the processing by referring to the particular hardware substitution table 26. When the particular hardware is for example the "sum of products processor" as indicated in the intermediate code 66, the hardware substitute "adder" and "multiplier" are detected as the hardware substitute for the particular hardware "sum of products processor" by the particular hardware substitution table 26 shown in FIG. 2.

The judging unit 44 judges whether or not all of the hardware substitutes that are detected in the detecting processing (532) of hardware substitutes are used in the source program 22 (533). More specifically the judging unit 44 judges whether or not all of the hardware substitutes are used in the source program 22 by judging the existence of all of the intermediate codes representing the hardware substitute in the intermediate codes generated at the replacing unit 42.

When it is judged that all of the hardware substitutes are used (YES: S33), the judging unit 44 extracts the operation instruction using the hardware substitutes. More specifically the judging unit 44 extracts the operation instruction using the hardware substitutes by extracting the intermediate code using the hardware substitutes out of the intermediate code generated at the replacing unit 42.

The judging unit 44 judges whether or not there is a case that simultaneous execution of an operation instruction using the particular hardware extracted in extracting processing for the particular hardware (S31) and an operation instruction using the hardware substitute extracted in the extracting processing for hardware substitute (S34)

Figure 8:
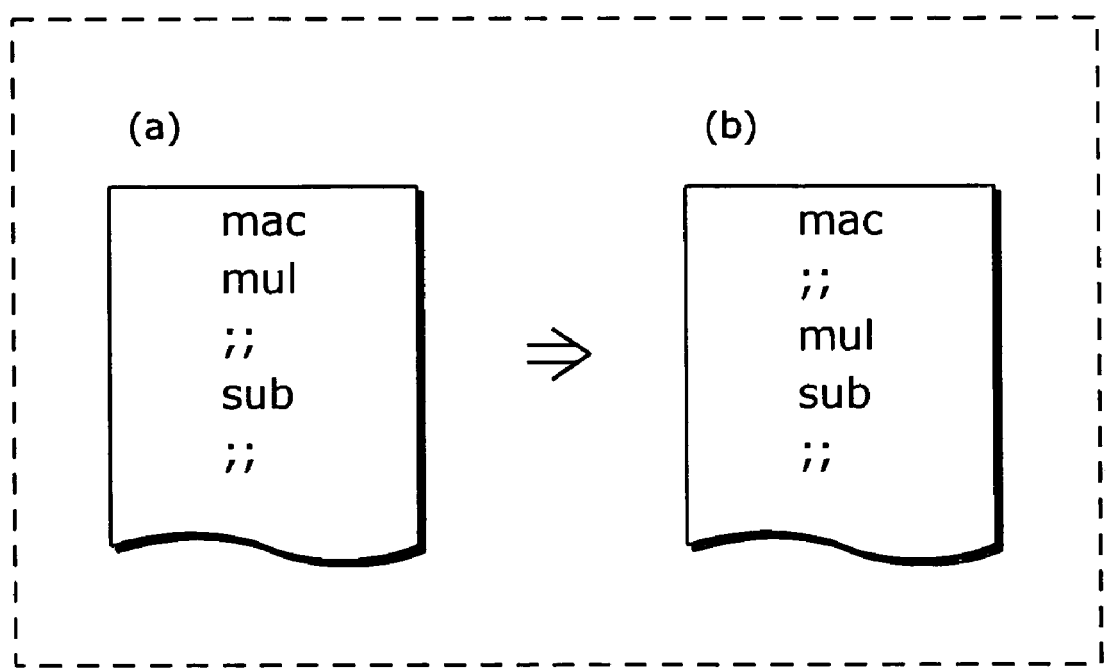
FIG. 8 shows an example for operation shifting.

When there is a case that both hardware are executed simultaneously (YES: S35), the judging unit 44 extracts the parts where the operation instructions are executed simultaneously, and shifts the operation using the hardware substitute of the said parts (S36). Hence, it is not necessary to hold plural hardware executing the same processing. FIG. 8 shows an example for operation shifting. An example of a string of mnemonic in the case of simultaneous execution of the particular hardware and the hardware substitute is shown in (a). And a string of mnemonic after the operation being shifted so as not to execute the both hardware simultaneously is shown in (b). The symbol ";;" in (a) and (b) in FIG. 8 represents a separator of parallel execution. More particularly, in FIG. 8 (a), it is shown that a specific operation function "mac" and its alternative instruction "mul" are executed simultaneously. As shown in FIG. 8 (b), the alternative instruction "mul" is shifted so as not to execute a specific operation function "mac" and its alternative instruction "mul" simultaneously.

In the case where the both hardware are not executed simultaneously (NO: S35), or in the case where the both hardware are not executed simultaneously by executing the operation shifting processing (S36), the judging unit 44 judges that "other hardware can substitute for the particular hardware" (S37). Subsequently the RTL description generating processing is executed (S25 in FIG. 6).

In the case where there are unused hardware substitutes in the source program 22 out of the hardware substitutes detected at the detecting processing of the hardware substitute (S32) (NO: S33), the judging unit 44 judges whether or not a part of the hardware substitute is used in the source program 22 (S38).

When it is judged that a part of the hardware substitute is used in the source program 22 (YES: S38), the judging unit 44 extracts the operation instruction using the hardware substitute (S39). More particularly the judging unit 44 extracts the operation instruction using the hardware substitute by extracting the intermediate code of the hardware substitute out of the intermediate code generated in the replacing unit 42.

Subsequently the judging unit 44 judges that whether there is a case that the operation instructions using the particular hardware extracted at the particular hardware extracting processing (S31) and using the hardware substitute extracted at the hardware substitute extracting processing (S39) are executed simultaneously.

When there is a case that both hardware are executed simultaneously (YES: S40), the judging unit 44 extracts the part where the operation instructions are executed simultaneously and shifts the operation using the hardware substitute of the said parts. Consequently it is not necessary to hold plural hardware executing the same processing.

When there is no case that the both hardware are executed simultaneously (NO: S40), or in the case where both hardware are not executed simultaneously by executing the operation shifting processing (S41), the judging unit 44 judges that "the particular hardware can substitute for other hardware" (S42). Subsequently the RTL description generating processing is executed (S26 in FIG. 6). Accordingly the circuit area can be downsized compared to the case where the particular hardware is substituted by the hardware substitute.

In the case where the hardware substitute detected at the detecting processing of the hardware substitute (S32) is not used in the source program 22 at all (NO: S38), the judging unit 44 judges the case as "Substitution is impossible" (S43). Subsequently the RTL description generating processing of the particular hardware is executed (S23 in FIG. 6).

An example of the RTL description generated using the above mentioned compiler apparatus will now be explained. FIG. 9 shows an example of a source program and an RTL description after converting the source program.

As an example, the source program 72 is given as the input in FIG. 9 (a). The source program 72 is an example of a source program describing the operation using the particular hardware and the operation using all of the hardware substitute. More specifically, in the source program 72, the variables a, b, c, d, e and f are used as input interface or output interface. And also, in the source program 72, the statement "d=a+b;" using an adder and the statement "f=b*c;" using a multiplier are defined other than the specific operation function "mac". It is shown that the necessary particular hardware to execute the specific operation function "mac" are one of each multiplier and adder according to the particular hardware substitution table 26 as shown in FIG. 2. Accordingly the particular hardware can be substituted by an adder and a multiplier.

FIG. 9 (b) shows the RTL description generated as input in the source program 72, in the case where there is an indication of the performance speed-focused option to the compiler apparatus 28, or there is no option specified. In this case the sum of products processor "MAC" can be substituted by an adder "ADD" and a multiplier "MUL", and moreover a sum of products processor "MAC" is generated. Consequently the circuit area is larger, while the parallel execution of add, multiply and sum of products operations are possible and sum of products operation is realized by an exclusive hardware. Accordingly the performance speed can be improved. The variables a, b, c, d, e and f for classes of input interface type or output interface type are connected to the input/output bus 78.

FIG. 9 (c) shows the RTL description generated using the source program 72 as input, in the case where there is an indication of the circuit area-focused option to the compiler apparatus 28. In this case, as mentioned above, the sum of products processor can be substituted by an adder "ADD" and a multiplier "MUL". Consequently by substituting the adder "ADD" and the multiplier "MUL" for sum of products processor", the reduction of the circuit area can be practicable. The variable tmp generated in order to realize sum of products operation intermediately is not the input/output interface type. The variable is not connected to the input/output bus 84. Consequently further downsizing of the circuit area is possible.

FIG. 10 shows another example of a source program and an RTL description after converting the source program.

As shown in FIG. 10(a), for example, the source program 92 is given as the input. The source program 92 is an example of a source program describing the operation using the particular hardware and the operation using a part of the hardware substitute. More particularly the variables a, b, c, d and e are used as the input interface or the output interface in the source program 92. And also, in the source program 92, a statement "d=a*b;" using a multiplier other than the specific operation function "mac" is defined. As mentioned above, the specific operation function "mac" can be substituted by an adder and a multiplier. Consequently a part of the hardware substitute of the specific operation function "mac" is used.

FIG. 10 (b) shows the RTL description generated using the source program 92 as input, in the case where there is an indication of the performance speed-focused option to the compiler apparatus 28, or there is no particular indication of the option. In this case the RTL description 94 of the particular hardware is generated (S23 in FIG. 6). Consequently the sum of products operation is executed at the sum of products processor "MAC" and the performance speed can be improved.

FIG. 10 (c) shows the RTL description generated using the source program 92 as input in the case where there is an indication of the circuit area-focused option to the compiler apparatus 28. According to the source program 92, multiply and sum of products operations are not executed simultaneously. Consequently the RTL description 100, such as substituting the multiplier by sum of products processor "MAC", is generated. In this case the multiplier is not generated and the circuit area can be reduced.

As mentioned hereinbefore, according to the embodiments of the present invention, it is possible to describe the particular hardware module, which description has not been possible by the existing programming language. And also a mechanism for analyzing directly the particular hardware module in the compiler is introduced. Consequently generation of the particular hardware module and the optimization considering the particular hardware module are possible.

INDUSTRIAL APPLICABILITY

The present invention is applicable to the HLS compiler generating RTL description from a source program, and specifically applicable to the HLS compiler and so on to generate particular hardware.

What is claimed is:

1. A compiling method for converting a source program and a header file included in the source program described in a programming language to a Register Transfer Level (RTL) description described in a hardware description language,
wherein a particular hardware is defined in the header file, said compiling method comprising:
a parser step of analyzing a syntax of the source program;
an intermediate code converting step of converting the syntactically analyzed source program to an intermediate code; and
an RTL description converting step of converting the intermediate code to an RTL description;
wherein said intermediate code converting step includes a detecting step of detecting a description of the particular hardware defined in the header file out of the source program, and a replacing step of replacing the particular hardware description detected in said detecting step with an intermediate code corresponding to the particular hardware;
wherein said compiling method further comprises a judging step of judging whether or not the intermediate code of the particular hardware obtained in said replacing step should be converted to the particular hardware language in an RTL description based on a predetermined instruction information;
wherein, in said RTL description converting step, the intermediate code is converted to the RTL description based on the judgment made in the judging step;
wherein the predetermined instruction information includes indication of performance speed-focused instruction for the hardware corresponding to the RTL description;
wherein, in said judging step, it is judged that the RTL description corresponding to the particular hardware is generated, when the predetermined instruction information indicates the performance speed-focused instruction; and
wherein in, said RTL description converting step, the RTL description is generated based on the judgment made in the judging step.

2. The compiling method according to claim 1,
wherein a class defining an input/output interface type of the particular hardware is defined in the header file, and
in said detecting step, the data of the input/output interface type is detected.

3. The compiling method according to claim 2,
wherein an input interface type and an output interface type are included as the input/output interface type.

4. The compiling method according to claim 2,
wherein a method in the class is a method defining an operator using a data of the input/output interface type as an operand,
in said detecting step, the operator conforming to the definition of the method in the class and the data used as operand by the operator are detected, and
in said replacing step, the detected operator and the data are replaced with intermediate codes corresponding to the particular hardware.

5. The compiling method according to claim 1,
wherein a specific operation function defining a particular operation instruction indicating an execution of operation using the particular hardware is defined in the header file, in said detecting step, a function conforming to the definition of the specific operation function is detected, and
in said replacing step, the detected function is replaced with an intermediate code of corresponding particular hardware.

6. A compiler for converting a source program and a header file included in the source program described in a programming language to a Register Transfer Level (RTL) description described in a hardware description language,
wherein a particular hardware is defined in the header file, said compiler causing a computer to execute:
a parser step of analyzing a syntax of the source program;
an intermediate code converting step of converting the syntactically analyzed source program to an intermediate code; and
an RTL description converting step of converting an intermediate code to an RTL description;
wherein said intermediate code converting step includes a detecting step of detecting the particular hardware defined in the header file out of the source program, and a replacing step of replacing the particular hardware detected in the detecting step with an intermediate code corresponding to the particular hardware;
wherein said compiler further causes the compiler to execute a judging step of judging whether or not the intermediate code of the particular hardware obtained in said replacing step should be converted to the particular hardware language in an RTL description based on a predetermined instruction information;
wherein, in said RTL description converting step, the intermediate code is converted to the RTL description based on the judgment made in said judging step;
wherein the predetermined instruction information includes indication of performance speed-focused instruction for the hardware corresponding to the RTL description;
wherein, in said judging step, it is judged that the RTL description corresponding to the particular hardware is generated, when the predetermined instruction information indicates the performance speed-focused instruction; and
wherein, in said RTL description converting step the RTL description is generated based on the judgment made in the judging step.

7. A computer-readable recording medium where a compiler is recorded, the compiler converting a source program and a header file included in the source program described in a programming language to a Register Transfer Level (RTL) description described in hardware description language,
wherein a particular hardware is defined in the header file, the compiler comprising:
a parser step of analyzing a syntax of the source program;
an intermediate code converting step of converting the syntactically analyzed source program to an intermediate code; and
causing a computer to execute an RTL description converting step of converting the intermediate code to RTL description;
wherein said intermediate code converting step includes a detecting step of detecting the particular hardware defined in the header file out of the source program, and a replacing step of replacing the particular hardware detected in said detecting step with an intermediate code corresponding to the particular hardware;
wherein said compiler further comprises a judging step of judging whether or not the intermediate code of the particular hardware obtained in said replacing step should be converted to the particular hardware language in an RTL description based on a predetermined instruction information;
wherein, in said RTL description converting step, the intermediate code is converted to the RTL description based on the judgment made in said judging step;
wherein the predetermined instruction information includes indication of performance speed-focused instruction for the hardware corresponding to the RTL description;
wherein, in said judging step, it is judged that the RTL description corresponding to the particular hardware is generated, when the predetermined instruction information indicates the performance speed-focused instruction; and
wherein, in said RTL description converting step, the RTL description is generated based on the judgment made in the judging step.

8. A compiler apparatus for converting a source program and a header file included in the source program described in a programming language to a Register Transfer Level (RTL) description described in hardware description language,
wherein a particular hardware is defined in the header file, said compiler apparatus comprising:
a parser unit operable to analyze a syntax of the source program;
an intermediate code converting unit operable to convert the syntactically analyzed source program to an intermediate code; and
an RTL description converting unit operable to convert the intermediate code to an RTL description;
wherein said intermediate code converting unit includes a detecting unit operable to detect the particular hardware defined in the header file out of the source program, and a replacing unit operable to replace the particular hardware detected in said detecting unit with an intermediate code corresponding to the particular hardware;
wherein said compiler apparatus further comprises a judging unit operable to judge whether or not the intermediate code of the particular hardware obtained by said replacing unit should be converted to the particular hardware language in an RTL description based on a predetermined instruction information;
wherein said RTL description converting unit converts the intermediate code to the RTL description based on the judgement made in said judging unit;
wherein the predetermined instruction information includes indication of performance speed-focused instruction for the hardware corresponding to the RTL description;
wherein, in said judging unit, it is judged that the RTL description corresponding to the particular hardware is generated, when the predetermined instruction information indicates the performance speed-focused instruction; and
wherein, in said RTL description converting unit, the RTL description is generated based on the judgement made in the judging unit.

9. A compiling method for converting a source program and a header file included in the source program described in a programming language to a Register Transfer Level (RTL) description described in a hardware description language,
  wherein a particular hardware is defined in the header file, said compiling method comprising:
  a parser step of analyzing a syntax of the source program;
  an intermediate code converting step of converting the syntactically analyzed source program to an intermediate code; and
  an RTL description converting step of converting the intermediate code to an RTL description;
  wherein said intermediate code converting step includes a detecting step of detecting a description of the particular hardware defined in the header file out of the source program and
  a replacing step of replacing the particular hardware description detected in said detecting step with an intermediate code corresponding to the particular hardware;
  wherein said compiling method further comprises a judging step of judging whether or not the intermediate code of the particular hardware obtained in said replacing step should be converted to the particular hardware language in an RTL description based on a predetermined instruction information;
  wherein, in said RTL description converting step, the intermediate code is converted to the RTL description based on the judgment made in the judging step;
  wherein the predetermined instruction information includes indication of circuit area-focused instruction for the hardware corresponding to the RTL description;
  wherein, in said judging step, it is judged that the RTL description overlapping the particular hardware and other hardware other than the particular hardware is generated, when the predetermined instruction information indicates the circuit area-focused instruction; and
  wherein, in said RTL description converting step, the RTL description is generated based on the judgment made in said judging step.

* * * * *